(12) United States Patent
Nayebi et al.

(10) Patent No.: US 6,384,638 B1
(45) Date of Patent: May 7, 2002

(54) DIFFERENTIAL CHARGE PUMP FOR PROVIDING A LOW CHARGE PUMP CURRENT

(75) Inventors: Mehrdad Nayebi, Palo Alto; Stephen D. Edwards, San Jose; Phil Shapiro, Palo Alto, all of CA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 09/217,668

(22) Filed: Dec. 21, 1998

(51) Int. Cl.$^7$ ................................................ H03K 5/22
(52) U.S. Cl. ......................................... 327/65; 327/156
(58) Field of Search ........................... 327/65, 67, 134, 327/136, 156, 157

(56) References Cited

U.S. PATENT DOCUMENTS

| | | | |
|---|---|---|---|
| 4,636,748 A | * 1/1987 | Latham, II | 331/17 |
| 5,189,313 A | * 2/1993 | Garuts | 327/170 |
| 5,369,375 A | * 11/1994 | Cooper et al. | 324/207.16 |
| 5,640,293 A | * 6/1997 | Dawes et al. | 361/103 |
| 5,736,880 A | * 4/1998 | Bruccoleri et al. | 327/157 |
| 5,945,855 A | * 8/1999 | Momtaz | 327/157 |
| 5,990,817 A | * 11/1999 | Belin et al. | 341/127 |

* cited by examiner

*Primary Examiner*—Terry D. Cunningham
(74) *Attorney, Agent, or Firm*—Wagner, Murabito & Hao LLP

(57) ABSTRACT

A differential charge pump for providing a low charge pump current. The present invention operates in one embodiment as part of an integrated circuit of a semiconductor chip by providing very small magnitude currents to other on-chip circuitry. Specifically, one embodiment of the present invention utilizes an R-2R resistor ladder circuit having moderate sized resistors to progressively reduce a large magnitude current into a very small magnitude current of accurate size. In this manner, available on-chip circuitry voltage can be used to produce the desired small magnitude of current without utilizing excessively large resistors, which can occupy too much die area. This is advantageous when dealing with specific types of on-chip components and circuitry which require accurate currents having very small magnitudes. For example, it may be desirable to integrate filter components (e.g., capacitors) on-chip together with accompanying phase lock loop (PLL) circuitry. However, smaller sized filter components typically need to be supplied accurate charge pump currents having very small magnitudes in order to produce the desired operational bandwidth. As such, the present invention is able to provide accurate charge pump currents having very small magnitudes for the smaller sized filter components from the available on-chip circuitry voltages. The present invention finds particular application within a clock generator circuit where it reduces clock jitter by enabling PLL filter components to be completely integrated on-chip.

23 Claims, 7 Drawing Sheets

DIFFERENTIAL CHARGE PUMP FOR PROVIDING A LOW CHARGE PUMP CURRENT

TECHNICAL FIELD

The present invention relates to the field of current injection circuits. More specifically, the present invention relates to the field of differential charge pump circuits.

BACKGROUND ART

High speed digital systems, such as engineering workstations and personal computers, require clock sources that have low jitter and low phase lock loop (PLL) bandwidths. Phase jitter in a system clock reduces the effective clock speed of the workstation or personal computer. More processing performance is gained, for a given clock rate, if the clock signal has less jitter. The PLL circuitry typically contains a voltage controlled oscillator (VCO) that receives a voltage level maintained by filter components. Normally, charging currents and voltage controlled oscillator gains are so high that large externally situated filter components are utilized in order to achieve the low jitter and low bandwidth requirements.

In operation, a PLL circuit injects current into filter components to establish a voltage at the input of a voltage controlled oscillator circuit in order to alter the frequency of oscillation of the PLL. This current is then ideally held constant over a long period of time (e.g., a "hold time") to maintain the oscillation frequency. During the hold time, the filter elements are electrically sampled by buffer circuits.

There are several disadvantages associated with utilizing large externally situated filter components. One of the disadvantages is that large external, e.g., "off-chip," filter components (e.g., capacitors, etc.) increase the overall cost of the digital system in part by making manufacturing more complex. Another disadvantage is that external components increase the physical size of the digital system. A further disadvantage is that off-chip filter components decrease system reliability by increasing the phase jitter by allowing external noise to be injected into the clock circuit through the PLL filter.

One prior art solution for alleviating the above mentioned disadvantages is to eliminate the external elements of the PLL filter. In order to eliminate external elements, it is necessary to use smaller sized filter components. However, as the size of the filter components are reduced, the amount of current supplied to them typically decreases proportionally in order for the PLL filter to achieve the same bandwidth. In other words, smaller sized filter components typically need to be supplied accurate currents having very small magnitudes to produce the same operational voltage range. Normally, currents are directly generated by utilizing a voltage change across a resistor. But there are disadvantages associated with this prior art technique.

One of the main disadvantages is that it typically requires the use of excessively large resistor values in order to directly generate small magnitude currents from available on-chip circuitry voltages. For example, a 100 nanoamperes (nA) current is directly generated when a 1 volt signal is applied across 10 megaohms (MΩ) of resistance. As such, the fabrication of excessively large resistor values (e.g., 10 MΩ) on-chip typically becomes impractical because they occupy too large of an amount of die area. Therefore, they are not cost effective.

DISCLOSURE OF THE INVENTION

Accordingly, it would be advantageous to provide a system that produces accurate small magnitude currents for particular on-chip circuitry without utilizing a large resistor value. Furthermore, it would be advantageous to provide a system that produces accurate small magnitude currents for particular on-chip circuitry utilizing available on-chip circuitry voltages. The present invention provides these advantages. These and other advantages of the present invention not specifically mentioned above will become clear within discussions of the present invention presented herein.

The present invention includes a system that is able to provide a charge pump current having a very small magnitude. The present invention operates in one embodiment as part of an integrated circuit of a semiconductor chip by providing very small magnitude currents to other on-chip circuitry. Specifically, one embodiment of the present invention utilizes an R-2R resistor ladder circuit having moderate sized resistors to progressively reduce a large magnitude current into a very small magnitude current of accurate size. In this manner, available on-chip circuitry voltage can be used to produce the desired small magnitude of current without utilizing excessively large resistors, which can occupy too much die area. This is advantageous when dealing with specific types of on-chip components and circuitry which require accurate currents having very small magnitudes. For example, it may be desirable to integrate filter components (e.g., capacitors) on-chip together with accompanying phase lock loop (PLL) circuitry. However, smaller sized filter components typically need to be supplied accurate charge pump currents having very small magnitudes in order to produce the desired operational bandwidth. As such, the present invention is able to provide accurate charge pump currents having very small magnitudes for the smaller sized filter components from the available on-chip circuitry voltages. Moreover, a system in accordance with the present invention provides these advantages while being fabricated utilizing bipolar technology which is less expensive than BiCMOS technology. The present invention finds particular application within a clock generator circuit where it reduces clock jitter by enabling PLL filter components to be completely integrated on-chip.

More specifically, in a clock generator circuit having a phase lock loop circuit, a subunit circuit comprising: a circuit for providing a stable first current; a semiconductor integrated circuit filter element for providing a voltage to a voltage controlled oscillator circuit, wherein the semiconductor integrated circuit filter element is coupled to receive the stable first current from the circuit; a resistor ladder circuit having n stages, wherein the $n^{th}$ stage is coupled to the semiconductor integrated circuit filter element to inject differential current across the semiconductor integrated circuit filter element; and a buffer circuit for determining a second current signal supplied to a first stage of the resistor ladder circuit.

Embodiments include the above and wherein the circuit for providing a stable first current further comprises: a current source circuit; and a current sink circuit. Additionally, the resistor ladder circuit mentioned above progressively attenuates the second current signal received by the first stage into the differential current. Moreover, the differential current mentioned within the previous paragraph is less than 100 nanoamperes. Furthermore, the resistor ladder circuit mentioned within the previous paragraph is an R-2R resistor ladder circuit. Additionally, the buffer circuit mentioned above is an emitter-coupled logic (ECL) buffer circuit.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

In the following detailed description of the present invention, a system which is able to provide a charge pump current that has a very small magnitude, numerous specific details are set forth in order to provide a thorough understanding of the present invention. However, it will be recognized by one of ordinary skill in the art that the present invention may be practiced without these specific details or with equivalent thereof. In other instances, well known methods, procedures, components, and circuits have not been described in detail as not to unnecessarily obscure aspects of the present invention.

The present invention includes a system which is able to provide a charge pump current that has a very small magnitude. The present invention operates in one embodiment as part of an integrated circuit of a semiconductor chip by providing very small magnitude currents to other on-chip circuitry. Specifically, one embodiment of the present invention utilizes an R-2R resistor ladder circuit having moderate sized resistors to progressively reduce a large magnitude current into a very small magnitude current of accurate size. In this manner, available on-chip circuitry voltage can be used to produce the desired small magnitude of current without utilizing excessively large resistors, which can occupy too much die area. This is advantageous when dealing with specific types of on-chip components and circuitry which require accurate currents having very small magnitudes. For example, it may be desirable to integrate filter components (e.g., capacitors) on-chip together with accompanying phase lock loop (PLL) circuitry. However, smaller sized filter components typically need to be supplied accurate charge pump currents having very small magnitudes in order to produce the desired operational bandwidth. As such, the present invention is able to provide accurate charge pump currents having very small magnitudes for the smaller sized filter components from the available on-chip circuitry voltages.

Therefore, the present invention provides a system that produces accurate small magnitude charge pump currents for particular on-chip circuitry without utilizing a large resistor value. Furthermore, the present invention provides a system that produces accurate small magnitude charge pump currents for particular on-chip circuitry utilizing available on-chip circuitry voltages. Moreover, a system in accordance with the present invention provides these advantages while being fabricated utilizing bipolar technology which is less expensive than BiCMOS technology. It is appreciated that BiCMOS technology is a combination of bipolar technology and Complementary Metal Oxide Semiconductor (CMOS) technology. The present invention finds particular application within a clock generator circuit where it reduces clock jitter by enabling PLL filter components to be completely integrated on-chip.

Figure 1A:
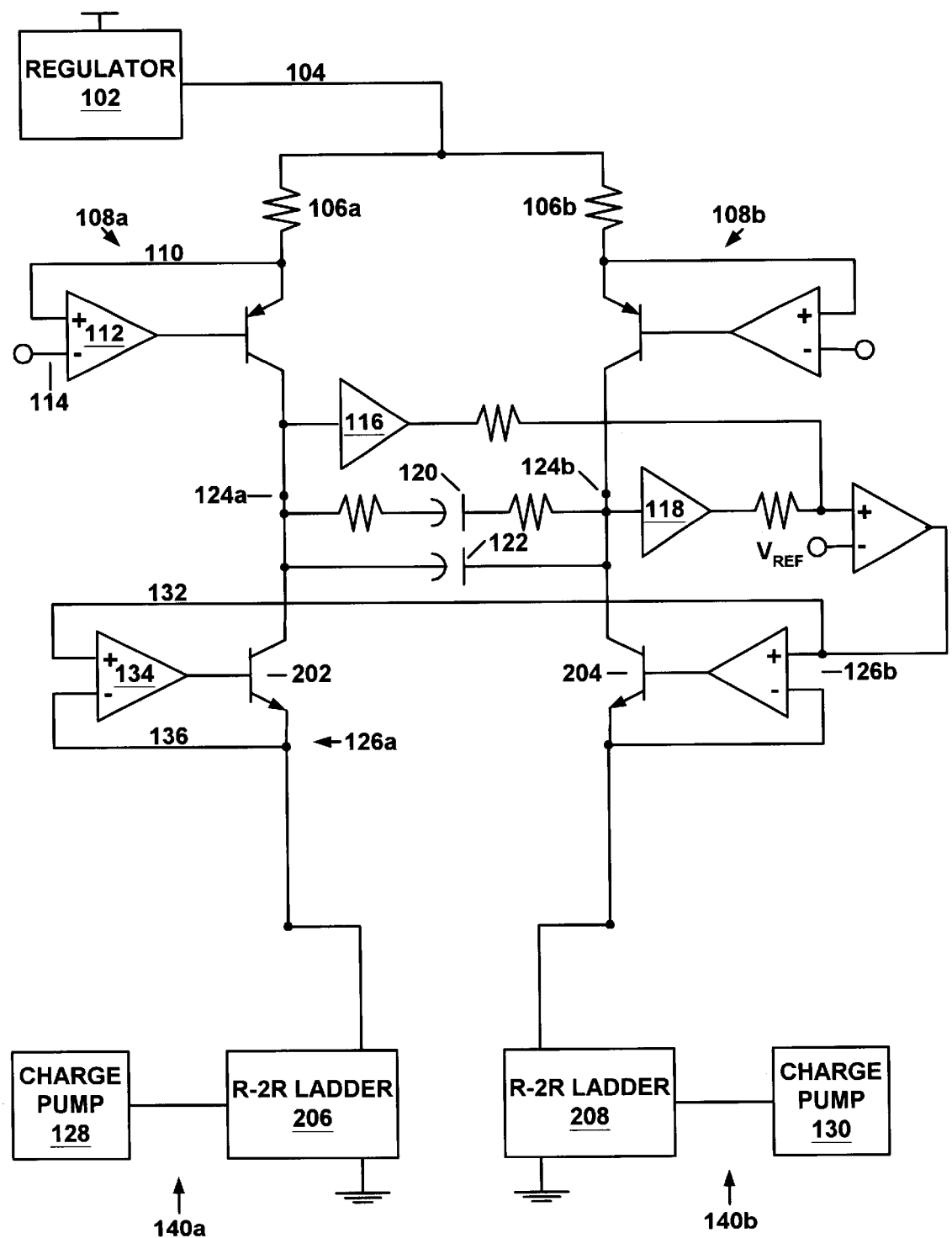
FIG. 1A illustrates a circuit 100 as one example in which the charge pump circuit in accordance with the present invention can provide very small magnitude currents.

FIG. 1A illustrates a circuit 100 as one example in which the charge pump circuits (128 and 130) in accordance with the present invention can provide very small magnitude currents. The very small magnitude output current of the present invention can operate in conjunction with a variety of different circuit systems where very small magnitude currents are required. Therefore, it is appreciated that the circuit 100 is only one example of such a circuit system. It should be appreciated that circuit 100 is fabricated utilizing bipolar technology since it is less expensive than BiCMOS technology.

Specifically, circuit 100 of FIG. 1A contains a differential circuit configuration. Circuit 100 is implemented "on chip," that is, a single integrated circuit chip is used to realize circuit 100. The high side of a power supply voltage is coupled to regulator circuit 102. Although the high side voltage can be of a wide range of voltages, in one embodiment the high side voltage is approximately within the range of 2.7 to 3.3 volts. The regulator 102 is coupled via line 104 to two ends of a differential circuit configuration having differential side 140a and differential side 140b. Each differential side includes a current source circuit (e.g., 108a) and a current sink circuit (e.g., 126a). Voltage supply line 104 is coupled to resistors 106a and 106b. Resistor 106a is coupled to the other components of current source 108a of the present embodiment.

Current source circuit 108b includes resistor 106b. Current source 108a contains a feedback loop 110 and an operational amplifier circuit 112 which receives a direct current (DC) bias voltage at its (−) input 114 and a feedback loop 110 at its (+) input. Current source circuits 108a and 108b are described in co-pending U.S. patent application Ser. No. 09/183,321, filed on Oct. 30, 1998, entitled "High Side Current Source Circuit Having Improved Output Impedance to Reduce Effects of Leakage Current," by Nayebi et al., now U.S. Pat. No. 6,304,132 and assigned to the assignee of the present invention and is herein incorporated by reference.

Each differential side 140a and 140b of FIG. 1A also contains a current sink circuit (e.g., 126a and 126b). Current sink circuits 126a and 126b are described in co-pending U.S. patent application Ser. No. 09/183,452, filed on Oct. 30, 1998, entitled "Low Side Current Sink Circuit Having Improved Output Impedance to Reduce Effects of Leakage Current," by Nayebi et al., and assigned to the assignee of the present invention and is herein incorporated by reference.

The current source circuits 108a and 108b are used, in one embodiment, in combination with current sink circuits 126a and 126b, to maintain current through integrated circuit filter elements 120 and 122. They provide a stable first current through the filter components 120 and 122. It is appreciated that filter components 120 and 122 are integrated circuit capacitors and as such they are integrated within the IC chip of circuit 100. Charge pump circuits 128 and 130 of the present invention inject additional current having small magnitudes, in accordance with the present invention, to thereby establish a differential voltage across the filter elements 120 and 122. It should be appreciated that these small magnitudes of current, e.g., less than 100 nanoamperes (nA), can be disrupted by the effects of leakage current from filter components 120 and 122. As such, it is important to minimize the leakage currents associated with the filter components 120 and 122, which is discussed below and within the co-pending US patent applications referred to herein.

It is appreciated that the high impedance buffer circuits 116 and 118 of the present embodiment are used to sample the voltage across the integrated circuit filter elements 120 and 122 for input to the voltage controlled oscillator (not shown). In order to reduce the effects of leakage current, the buffer circuits 116 and 118 have high input impedances. The differential voltage is used as an input to the voltage controlled oscillator circuit of a phase lock loop circuit (not shown). It is desired to provide a stable voltage at the input of the voltage controlled oscillator circuit in order to reduce jitter within the output signal generated by circuit 100. One way that the voltage can change across the filter elements 120 and 122 is as a result of current fluctuations due to leakage current at the inputs of the buffers 116 and 118. For this reason, buffers 116 and 118 have high impedance inputs to reduce leakage current. The high impedance buffer circuits 116 and 118 are described in co-pending U.S. patent application Ser. No. 09/183,198, filed on Oct. 30, 1998, entitled "High Input Impedance Buffer Circuit Having High Output Impedance," by Nayebi et al., and assigned to the assignee of the present invention and is herein incorporated by reference.

Specifically, leakage current across the filter elements 120 and 122 charges the filter elements 120 and 122 thereby changing their differential voltage. In circuit 100, the filter elements, e.g., capacitors 120 and 122, are designed to be small internal "on-chip" devices (having correspondingly small capacitance values). As a result, the voltage level across these small filter elements 120 and 122 is very sensitive to small changes in the injected currents at nodes 124a and 124b. The changing differential voltage across filter elements 120 and 122 causes time jitter in circuit 100 because it causes changes in the input voltage of the voltage controlled oscillator (not shown).

Therefore, in accordance with the design of the present invention, the current through each differential side 140a and 140b of FIG. 1A is very stable once it is set to a desired level and held there over time. In accordance with the present invention, by reducing leakage current, the filter elements 120 and 122 maintain a stable differential voltage level. In operation, the current supplied from current sources 108a and 108b (and sank by current sinks 126a and 126b) is adjusted to set a particular operational frequency of circuit 100 and then held over a hold period. Hold periods are situated in between phase lock loop correction pulses. The present invention advantageously reduces the effects of leakage current at the inputs of buffers 116 and 118 as one way to stabilize the current through the filter elements 120 and 122 during the hold periods. The effects of leakage current are reduced, in accordance with the present invention, by establishing a high input impedance for buffer circuits 116 and 118. Leakage current is reduced thereby providing a stable input voltage to the voltage controlled oscillator (not shown). The stable input voltage thereby reduces jitter in the output signal of circuit 100.

The circuits of FIG. 1A are also designed for $R_{CB}$ cancellation as described in detail in the following co-pending applications which are herein incorporated by reference: co-pending U.S. patent application Ser. No. 09/219,196, concurrently filed herewith, now U.S. Pat. No. 6,064,274, entitled "RCB Cancellation in High-Side Low Power Supply Current Sources," by Nayebi et al., and assigned to the assignee of the present invention; co-pending U.S. patent application Ser. No. 09/219,200, concurrently filed herewith, now U.S. Pat. No. 6,100,726, entitled "High Input Impedance Buffer Circuit Having a High-Side Current Source Circuit with RCB Cancellation," by Nayebi et al., and assigned to the assignee of the present invention; and co-pending U.S. patent application Ser. No. 09/220,709, concurrently filed herewith, entitled "Rcb Cancellation in Low-Side Low Power Supply Current Sources," by Nayebi et al., and assigned to the assignee of the present invention.

Figure 1B:
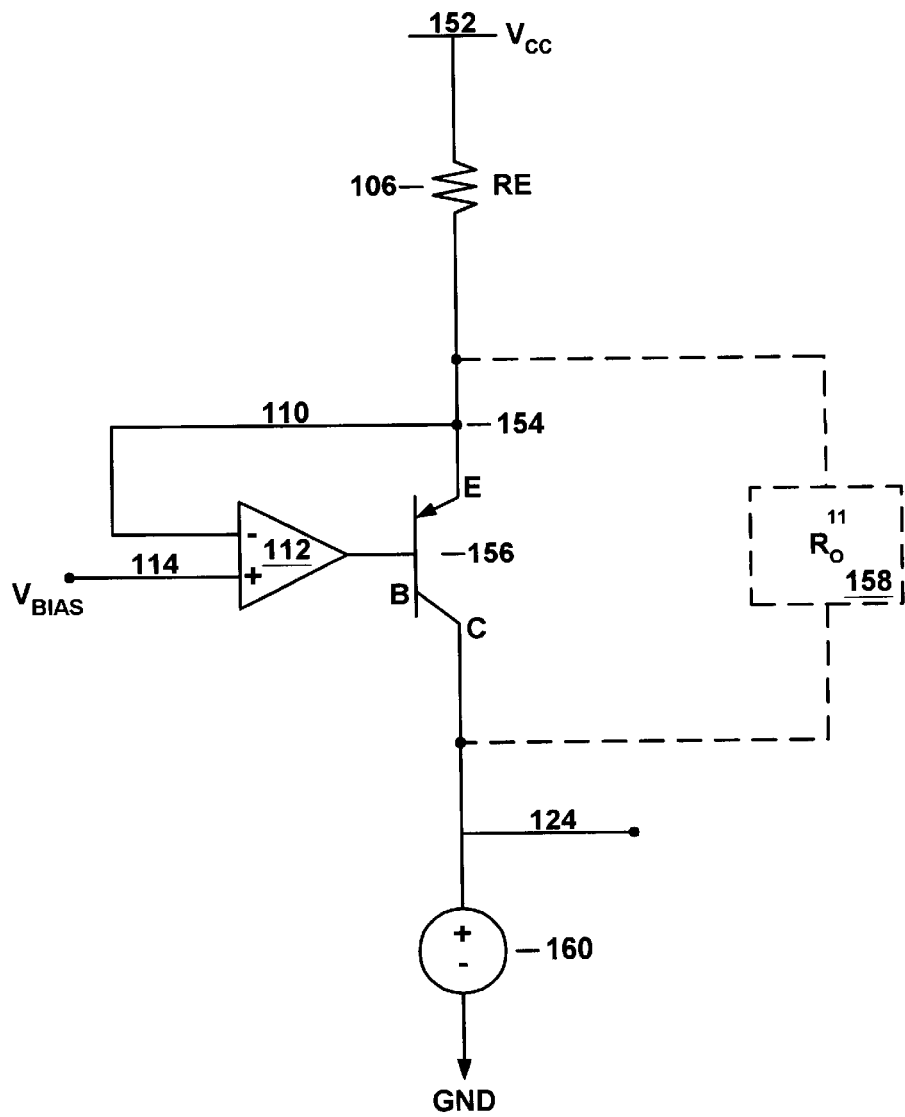
FIG. 1B illustrates a circuit block diagram of the high side current source circuit of the present invention having high output impedance.

FIG. 1B illustrates one embodiment of the high-side current source circuit 108 of the present invention. In accordance with the present invention, current source circuit 108 has a very high output impedance, R"o, shown as 158. Current source circuit 108 contains an emitter degeneration resistor, RE, 106 located in series between a low power supply voltage 152 and a first node 154. Circuit 108 includes a transistor 156 having its emitter (E) coupled to the first node 154. Output current is supplied from the current source circuit 108 at node 124 which is coupled to the collector (C) of transistor 156. An exemplary load 160 is shown coupled to node 124, but this load 160 is not part of the current source 108 of the present invention.

The base (B) of transistor 156 is coupled to the output of the operational amplifier circuit 112. The negative (−) input of the operational amplifier circuit 112 is coupled via feedback loop 110 to the first node 154. The positive (+) input of the operational amplifier circuit 112 is coupled to a bias direct current (DC) voltage level over line 114 called Vbias. In this arrangement, the output impedance, R"o, is measured from node 154 to node 124 as shown by the dashed element 158 which is not a structural element but rather a model of R"o. In one embodiment of the present invention, transistor 156 is a PNP transistor, Vcc 152 is approximately between 2.0 and 3.3 volts and RE is approximately 30 k ohms, although other configurations can be used.

The emitter and base of transistor 156 of FIG. 1B are in the feedback loop. Vbias at 114 is equal to the voltage at the emitter (E) of transistor 156 and these values are held relatively constant by circuit 156. That is, any change in the voltage at the emitter (E) of transistor 156 caused by leakage current is compensated for by the closed feedback loop thereby holding the voltage at node 154 constant. Circuit 108 dynamically compensates the voltage at node 154 over changes in load, temperature, etc.

Figure 1C:
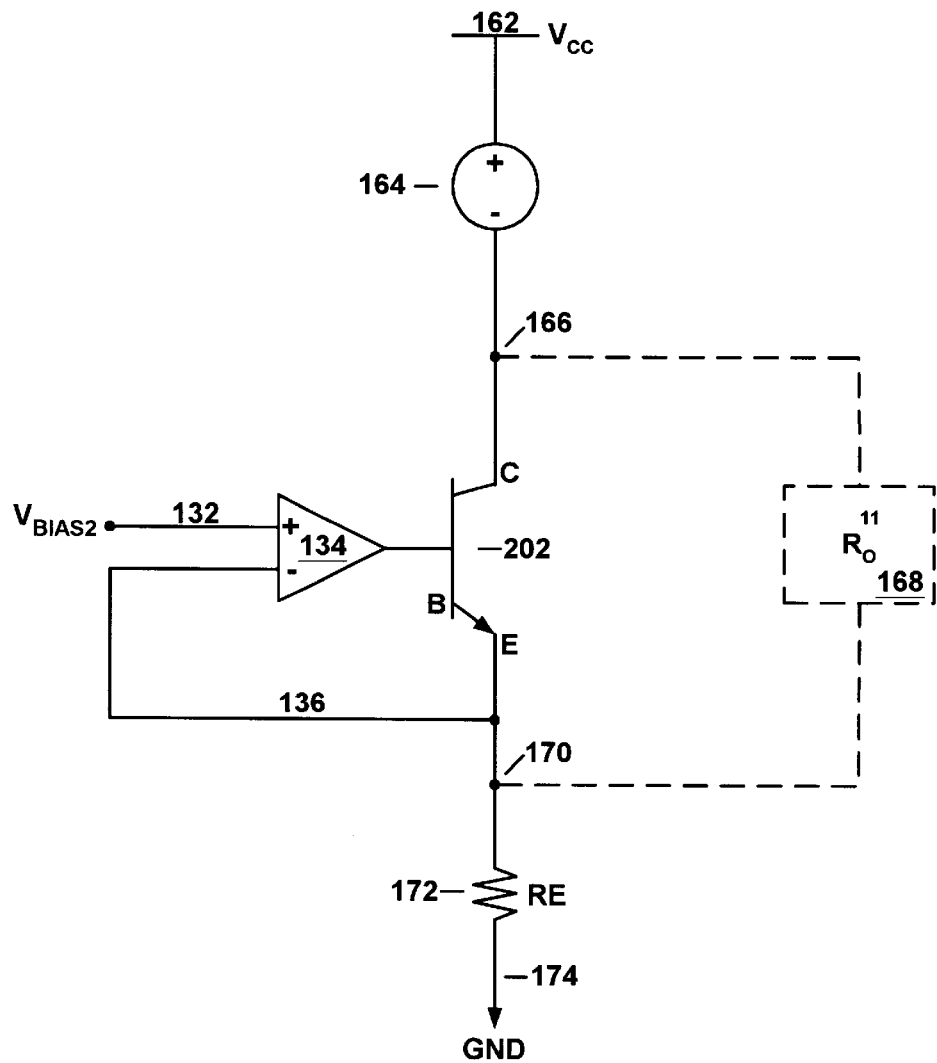
FIG. 1C illustrates a circuit block diagram of the low side current sink circuit of the present invention having high output impedance.

FIG. 1C illustrates one embodiment of the low-side current sink circuit 126 of the present invention. In accordance with the present invention, current sink circuit 126 has a very high output impedance, R"o, shown as 168. Current sink circuit 126 contains an emitter degeneration resistor, RE, 172 located in series between a first node 170 and the low side 174 (e.g., ground) of a power supply voltage. In one embodiment, the voltage supply (Vcc) 162 is a low voltage power supply. Circuit 126 includes a transistor 202 having its emitter (E) coupled to the first node 170. Current is dropped from the current sink circuit 126 at node 166 which is coupled to the collector (C) of transistor 202. An exemplary voltage load 164 is shown coupled to Vcc 162 and to node 166, but this load is not part of the current sink 126 of the present invention.

The base (B) of transistor 202 is coupled to the output of an operational amplifier circuit 134. The negative (−) input of the operational amplifier circuit 134 is coupled via feedback loop 136 to the first node 170. The positive (+) input of the operational amplifier circuit 134 is coupled to a bias direct current (DC) voltage level over line 132 called Vbias2. In one embodiment, the bias voltage over line 132 is maintained by an operational amplifier (FIG. 1A). In the arrangement of FIG. 1C, the output impedance, R"o, is measured from node 170 to node 166 as shown by t he dashed element 168 which is not a structural element but rather a model of R"o. In one embodiment of the present invention, transistor 202 is an NPN transistor, Vcc 162 is approximately between 2.0 and 3.3 volts and RE 172 is approximately 30 k ohms al though other configurations can be used.

The emitter and base of transistor 202 of FIG. 1C are in the feedback loop. Vbias2 at 132 is equal to the voltage at the emitter (E) of transistor 202 and these values are held relatively constant by circuit 126. That is, any change in the voltage at the emitter (E) of transistor 202 caused by leakage current is compensated for by the closed feedback loop thereby holding the volt age at node 170 constant. Circuit 126 dynamically compensates the voltage at node 170 over changes in load, temperature, etc.

Figure 2:
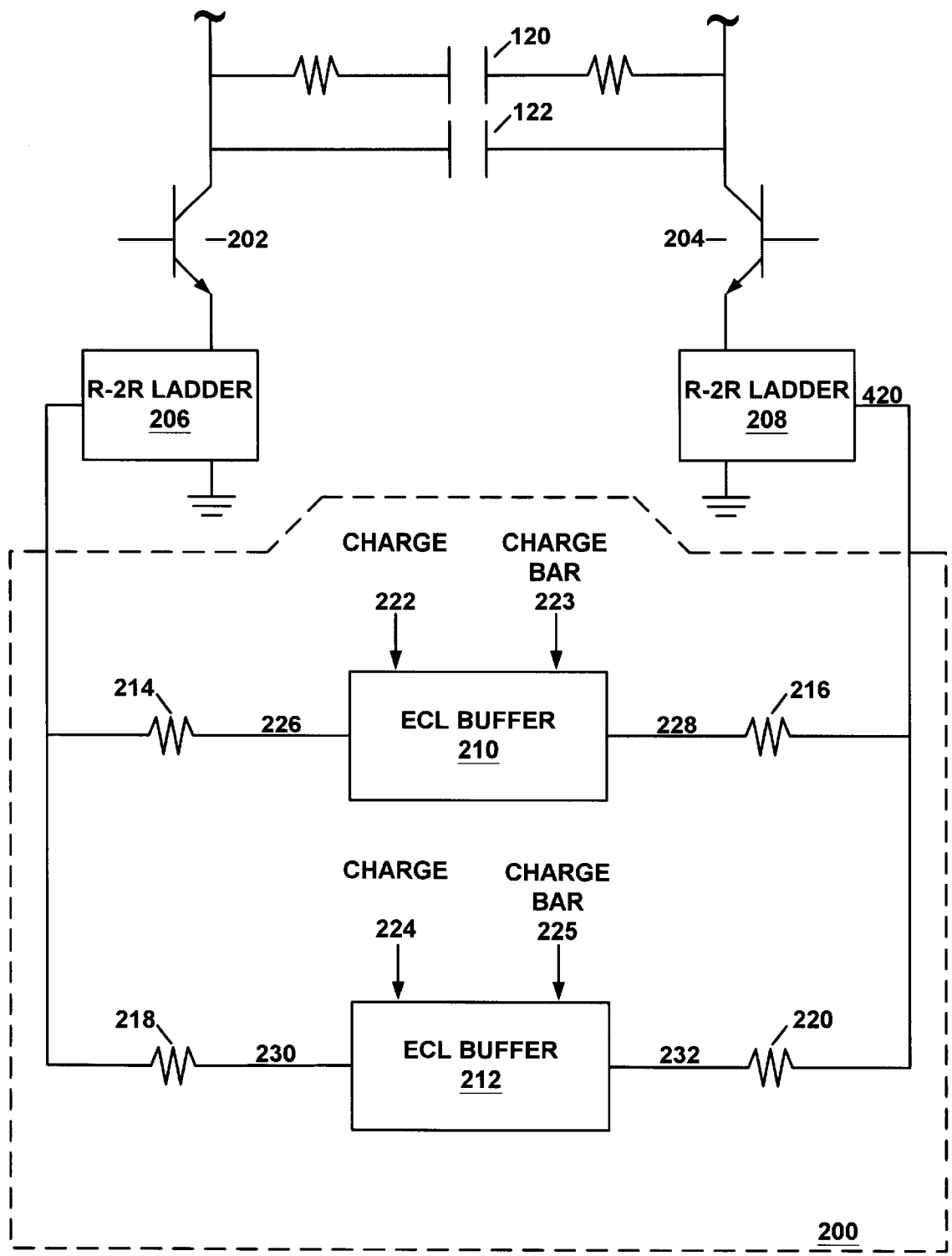
FIG. 2 is a block diagram of one embodiment of the charge pumps of FIG. 1A in accordance with the present invention.

FIG. 2 is a block diagram of circuit 200 which is one embodiment of the charge pumps 128 and 130 in accordance with the present invention. FIG. 2 represents the lower portion of circuit 100 as shown. The main function of circuit 200 (along with resistor ladders 206 and 208) is to inject additional current having very small magnitude (e.g., less than 100 nA) into filter elements 120 and 122 to establish a differential voltage across them. The differential voltage of the filter elements 120 and 122 is used as an input to the voltage controlled oscillator circuit (not shown). It should be appreciated that circuit 200 is fabricated utilizing bipolar technology since it is less expensive than BiCMOS technology.

Generally, emitter-coupled logic (ECL) buffer circuits 210 and 212 of circuit 200 each generate voltages which are received by R-2R resistor ladder circuits 206 and 208. The main function of the R-2R resistor ladders 206 and 208 is to progressively reduce input current and then output a resulting current having a very small magnitude. The resulting output current of the R-2R resistor ladder 206 is translated into a current into filter components 120 and 122. Moreover, the resulting output current of the R-2R resistor ladder 208 is translated into a current into filter components 120 and 122. In one mode, equal currents are supplied to both sides of filter elements 120 and 122 by controlling the outputs 226–232 of the ECL buffers 210 and 212. Therefore, the net current supplied to the filter elements 120 and 122 is zero. By adjusting the outputs 226–232 of the ECL buffers 210 and 212, a net current is supplied to the filter elements 120 and 122 which establishes a differential voltage across them.

For instance, during one embodiment of a non-charging state of filter elements 120 and 122, outputs 228 and 230 produce the same low voltage signal while outputs 226 and 232 produce the same high voltage signal. These output voltage signals produce currents that flow through transistors 202 and 204 equally so that there is zero net current feeding the filter elements 120 and 122. During one embodiment of a charging state of filter elements 120 and 122, outputs 228 and 232 produce the same high voltage signal while outputs 226 and 230 produce the same low voltage signal. These output voltage signals produce currents that forces current through transistor 204, but there is no current through transistor 202. As such, there is a net current feeding the filter elements 120 and 122.

Specifically, when the ECL buffer circuits 210 and 212 of FIG. 2 are operating, each generates voltage and has differential outputs. Therefore, when one output (e.g., 226) of ECL buffer 210 produces a high voltage, its other output (e.g., 228) produces a low voltage. It is appreciated that the outputs 230 and 232 of ECL buffer 212 operate in the same manner as the outputs 226 and 228 of ECL buffer 210. Furthermore, ECL buffers 210 and 212 receive control signals which are utilized to control outputs 226–232. For instance, ECL buffer 210 receives a charge control signal 222 and a charge bar control signal 223 while ECL buffer 212 receives a charge control signal 224 and a charge bar control signal 225. As such, there are four voltage output states that result from controlling outputs 226–232.

One of the four voltage output states is a non-charging state which occurs when the ECL buffer 210 receives a charge control signal 222 having a high voltage and a charge bar control signal 223 having a low voltage. Simultaneously, the ECL buffer 212 receives a charge control signal 224 having a low voltage and a charge bar control signal 225 having a high voltage. Therefore, outputs 228 and 230 each produce the same high voltage signal while outputs 226 and 232 each produce the same low voltage signal. As such, the high voltage signal from output 228 passes through resistor 216 and a resulting current is received by the R-2R resistor ladder circuit 208. Moreover, the low voltage signal from output 232 passes through resistor 220 and a resulting current is also received by the R-2R resistor ladder circuit 208. The combined current received by the R-2R resistor ladder 208 is progressively reduced and results in an output current having a very small magnitude that passes through transistor 204 into filter components 120 and 122.

Simultaneously, the low voltage signal from output 226 passes through resistor 214 and a resulting current is received by the R-2R resistor ladder circuit 206. Moreover, the high voltage signal from output 230 passes through resistor 218 and a resulting current is also received by the R-2R resistor ladder circuit 206. The combined current received by the R-2R resistor ladder 206 is progressively reduced and results in an output current having a very small magnitude that passes through transistor 202 into filter components 120 and 122. Therefore, the currents flowing through transistors 202 and 204 are equal and there is a zero net current feeding the filter components 120 and 122. In other words, there is no differential current flowing into the filter components 120 and 122.

Another non-charging state of circuit 200 of FIG. 2 occurs when the ECL buffer 210 receives a charge control signal 222 having a low voltage and a charge bar control signal 223 having a high voltage. Simultaneously, the ECL buffer 212 receives a charge control signal 224 having a high voltage and a charge bar control signal 225 having a low voltage. As such, outputs 226 and 232 produce the same high voltage signal while outputs 228 and 230 produce the same low voltage signal. It is appreciated that the voltage signals produced at outputs 226–232 operate in a similar manner as described above. Therefore, the combined currents received by the R-2R resistor ladders 206 and 208 are equal and result in a zero net current feeding the filter components 120 and 122.

A high charging state of circuit 200, as defined within the present embodiment, occurs when the ECL buffer 210 receives a charge control signal 222 having a high voltage and a charge bar control signal 223 having a low voltage.

Simultaneously, the ECL buffer 212 receives a charge control signal 224 having a high voltage and a charge bar control signal 225 having a low voltage. Therefore, outputs 228 and 232 produce the same high voltage signal while outputs 226 and 230 produce the same low voltage signal. As such, the high voltage signal from output 228 passes through resistor 216 and a resulting current is received by the R-2R resistor ladder 208. Moreover, the high voltage signal from output 232 passes through resistor 220 and a resulting current is also received by the R-2R resistor ladder 208. The combined current received by the R-2R resistor ladder 208 is progressively reduced and results in an output current having a very small magnitude that passes through transistor 204 into filter components 120 and 122. Conversely, the combined low voltage signals of outputs 226 and 230 do not result in sending current through transistor 202 into filter components 120 and 122. Therefore, there is a net current feeding the filter components 120 and 122.

A low charging state of circuit 200 of FIG. 2, as defined within the present embodiment, occurs when the ECL buffer 210 receives a charge control signal 222 having a low voltage and a charge bar control signal 223 having a high voltage. Simultaneously, the ECL buffer 212 receives a charge control signal 224 having a low voltage and a charge bar control signal 225 having a high voltage. Therefore, outputs 226 and 230 produce the same high voltage signal while outputs 228 and 232 produce the same low voltage signal. As such, the high voltage signal from output 226 passes through resistor 214 and a resulting current is received by the R-2R resistor ladder 206. Moreover, the high voltage signal from output 230 passes through resistor 218 and a resulting current is also received by the R-2R resistor ladder 206. The combined current received by the R-2R resistor ladder 206 is progressively reduced and results in an output current having a very small magnitude which passes through transistor 202 into filter components 120 and 122. Conversely, the combined low voltage signals of outputs 228 and 232 do not result in sending current through transistor 204 into filter components 120 and 122. Therefore, there is a net current feeding the filter components 120 and 122.

Table 1 below illustrates the four states that can exist within circuit 200 by changing the voltage signal produced at outputs 226–232 of the emitter-coupled logic (ECL) buffers 210 and 212.

TABLE 1

| No Net Differential Current | |
|---|---|
| Control Signals: | |
| Charge 222 = Low | Charge Bar 223 = High |
| Charge 224 = High | Charge Bar 225 = Low |
| Resulting Output Signals: | |
| Output 226 = High | Output 228 = Low |
| Output 230 = Low | Output 232 = High |
| No Net Differential Current | |
| Control Signals: | |
| Charge 222 = High | Charge Bar 223 = Low |
| Charge 224 = Low | Charge Bar 225 = High |
| Resulting Output Signals: | |
| Output 226 = Low | Output 228 = High |
| Output 230 = High | Output 232 = Low |

TABLE 1-continued

| High State | |
|---|---|
| Control Signals: | |
| Charge 222 = High | Charge Bar 223 = Low |
| Charge 224 = High | Charge Bar 225 = Low |
| Resulting Output Signals: | |
| Output 226 = Low | Output 228 = High |
| Output 230 = Low | Output 232 = High |
| Low State | |
| Control Signals: | |
| Charge 222 = Low | Charge Bar 223 = High |
| Charge 224 = Low | Charge Bar 225 = High |
| Resulting Output Signals: | |
| Output 226 = High | Output 228 = Low |
| Output 230 = High | Output 232 = Low |

Figure 3:
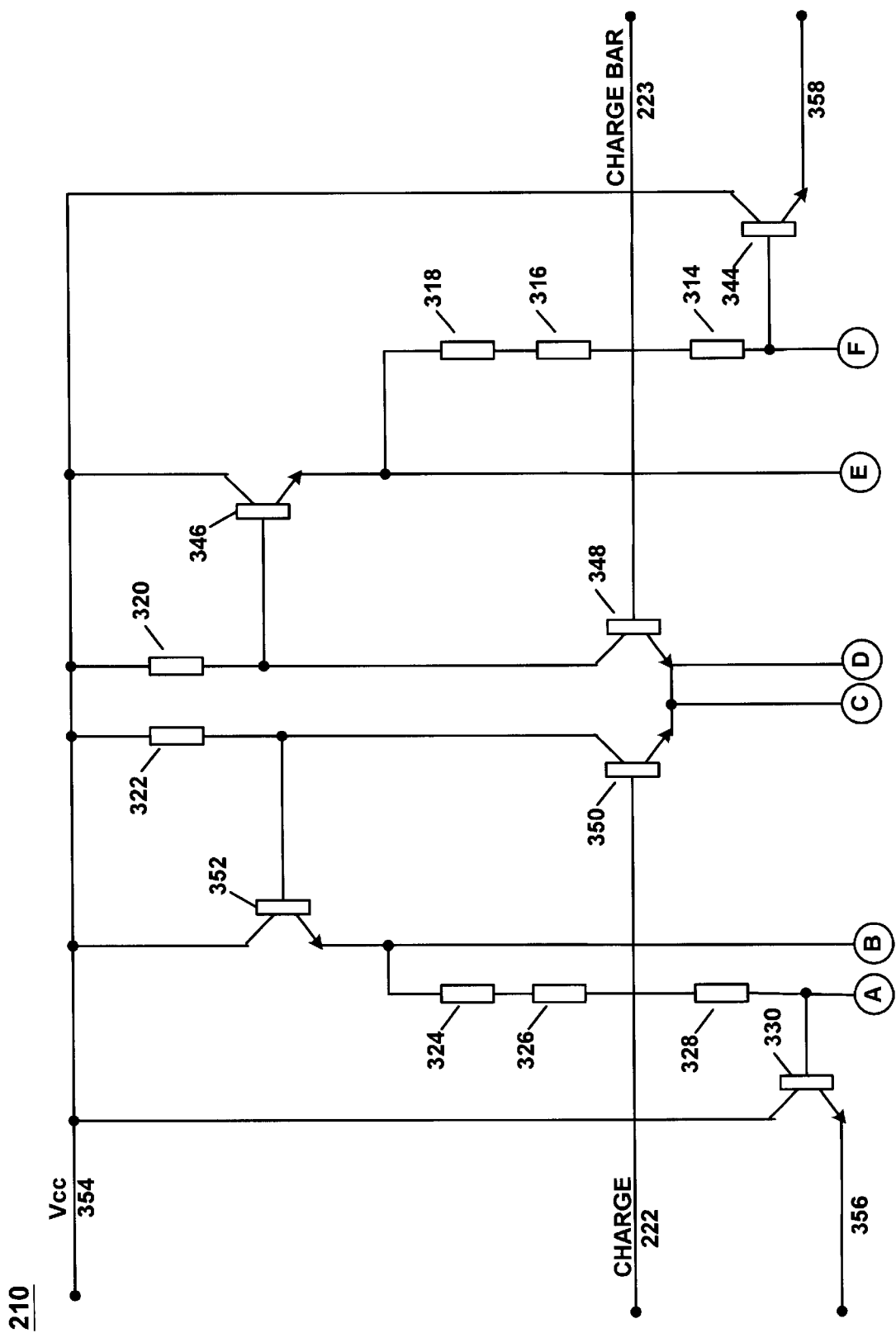
FIG. 3 is a schematic illustrating one embodiment of the internal circuitry utilized within an emitter-coupled logic (ECL) buffer of FIG. 2 in accordance with the present invention.
Figure 3:
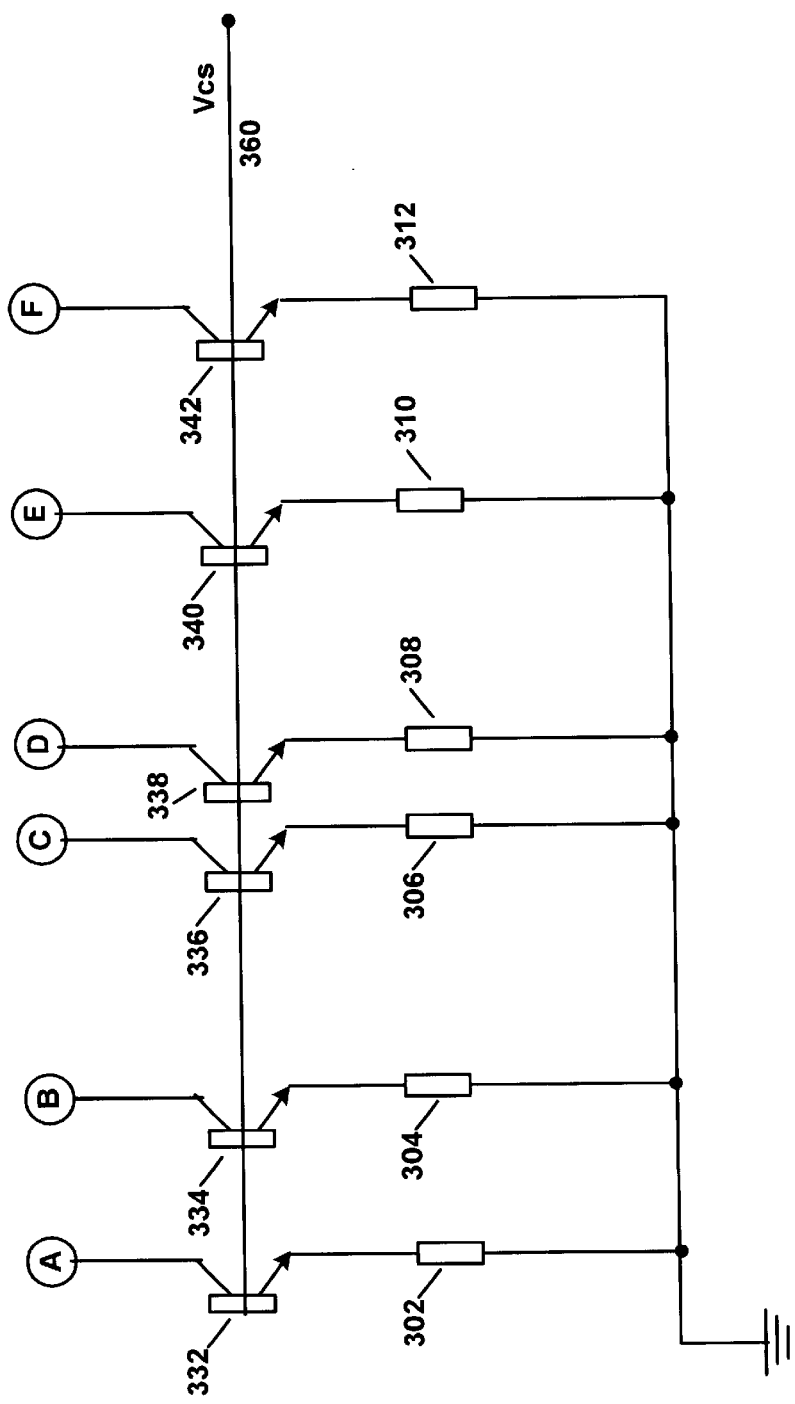

FIG. 3 illustrates a circuit 210 which is one embodiment of the internal circuitry of the emitter-coupled logic (ECL) buffer 210 in accordance with the present invention. It should be appreciated that circuit 210 can also be used as one embodiment of the internal circuitry of the ECL buffer 212 in accordance with the present invention. While operating, circuit 210 generates complementary fixed voltage changes at the emitters of transistors 330 and 344. The voltage changes are determined by the tail current of transistors 348 and 350 and the resistance values of resistors 320 and 322. The tail current depends on the resistance values of resistors 306 and 308. This means that the voltage change is temperature and process independent since this voltage depends on the ratio of resistors. Level shifting on each side of the circuit 210 is provided by running a current through resistors. For instance, on the transistor 348 side of the circuit 210, the level shift consists of a current generated by transistor 342 passing through resistors 314, 316, and 318. Identical circuitry is used on the transistor 350 side of circuit 210 using transistor 332 as a current source and resistors 328, 326, and 324 to provide resistance. It is appreciated that within the embodiment of circuit 210 transistors 330–352 are PNP transistor devices. It should be further appreciated that circuit 210 is fabricated utilizing bipolar technology since it is less expensive than BiCMOS technology.

With respect to FIG. 3, a voltage source line ($V_{CC}$) 354 is coupled to the collector of transistors 330, 344, 346, and 352. The base of transistor 330 is coupled to the collector of transistor 332 and also coupled to resistor 328. The emitter of transistor 330 is coupled to an output line 356. It should be appreciated that within one embodiment of ECL buffer 210 in accordance with the present invention, output line 356 is the output 226 which is coupled to resistor 214 of FIG. 2. The base of transistor 344 is coupled to the collector of transistor 342 and also coupled to resistor 314. The emitter of transistor 344 is coupled to an output line 358. It should be further appreciated that within one embodiment of ECL buffer 210 in accordance with the present invention, output line 358 is the output 228 which is coupled to resistor 216 of FIG. 2. With respect to ECL buffer 212, the outputs are 230 and 232, respectively.

The emitter of transistor 352 is coupled to resistor 324 and also coupled to the collector of transistor 334. Resistor 324 is coupled in series to resistor 326 which is coupled in series to resistor 328. Resistor 328 is coupled to the base of transistor 330 and also coupled to the collector of transistor 332. The emitter of transistor 332 is coupled to resistor 302 which is coupled to ground. The base of transistor 332 is coupled to the base of transistor 334. The emitter of transistor 334 is coupled to resistor 304 which is coupled to ground.

The voltage supply 354 of FIG. 3 is coupled to resistor 322 which is coupled to the base of transistor 352 and also coupled to the collector of transistor 350. The base of transistor 350 is coupled to receive the charge input signal 222. The emitter of transistor 350 is coupled to the emitter of transistor 348, the collector of transistor 336, and also coupled to the collector of transistor 338. The emitter of transistor 336 is coupled to resistor 306 which is coupled to ground. The base of transistor 336 is coupled to the base of transistor 334 and also coupled to the base of transistor 338. The emitter of transistor 338 is coupled to resistor 308 which is coupled to ground.

The emitter of transistor 346 is coupled to resistor 318 and also coupled to the collector of transistor 340. Resistor 318 is coupled in series to resistor 316 which is coupled in series to resistor 314. Resistor 314 is coupled to the base of transistor 344 and also coupled to the collector of transistor 342. The emitter of transistor 342 is coupled to resistor 312 which is coupled to ground. The base of transistor 342 is coupled to the base of transistor 340 which is coupled to the base of transistor 338. The emitter of transistor 340 is coupled to resistor 310 which is coupled to ground. It should be appreciated that the bases of transistors 332–342 are coupled to a direct current (DC) voltage source ($V_{CS}$) 360 which is used to set the operating currents of transistors 332–342.

The voltage supply 354 of FIG. 3 is coupled to resistor 320 which is coupled to the base of transistor 346 and also coupled to the collector of transistor 348. The base of transistor 348 is coupled to receive the charge bar input signal 224. The emitter of transistor 348 is coupled to the emitter of transistor 350, the collector of transistor 336, and also coupled to the collector of transistor 338.

Figure 4:
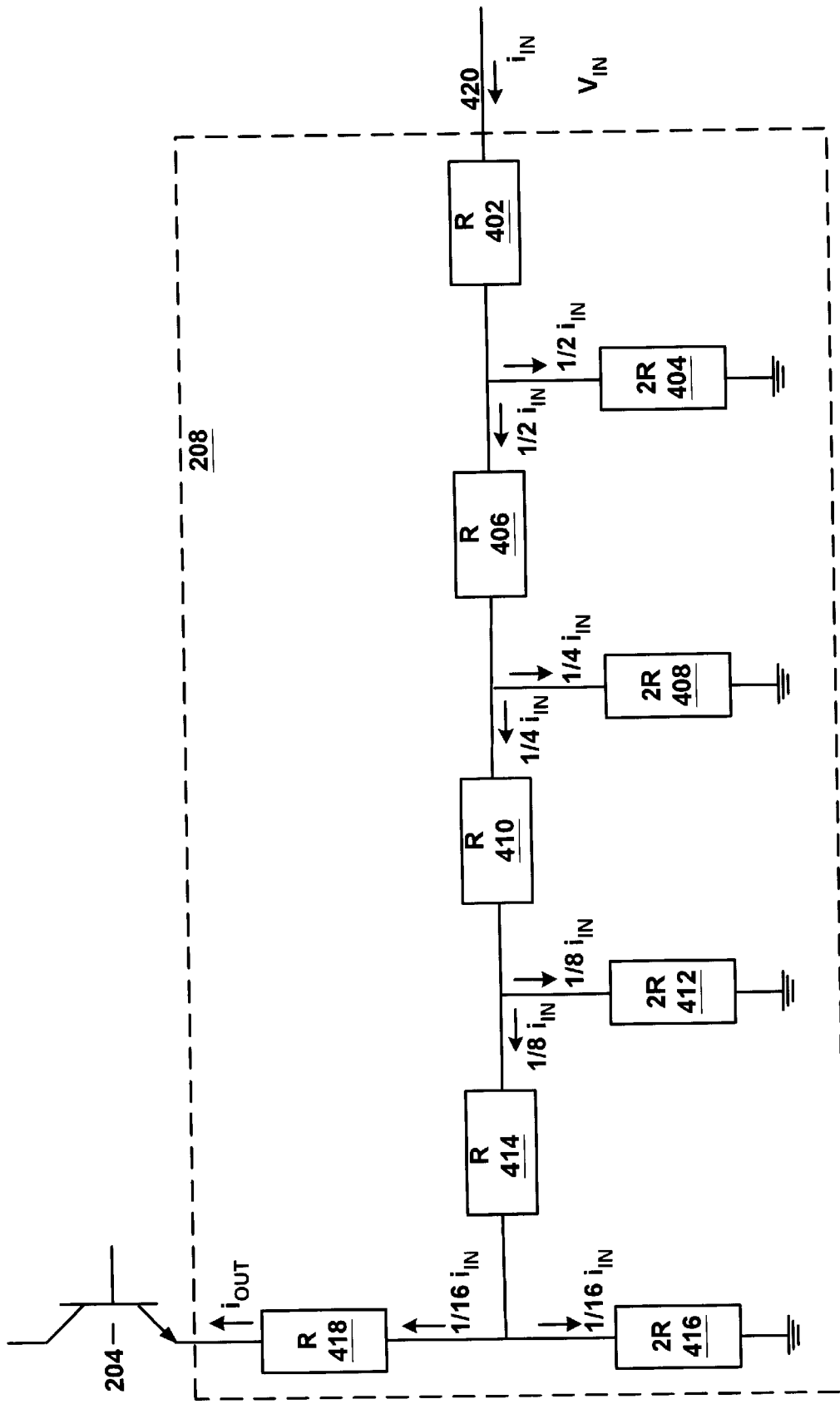
FIG. 4 is a schematic diagram illustrating one embodiment of internal circuitry utilized within an R-2R resistor ladder circuit of FIG. 2 in accordance with the present invention.

FIG. 4 is a schematic diagram illustrating one embodiment of internal circuitry 208 which is utilized within the R-2R resistor ladder circuit 208 in accordance with the present invention. It should be appreciated that circuit 208 can also be used as one embodiment of the internal circuitry of the R-2R resistor ladder circuit 206 in accordance with the present invention. The purpose of circuit 208, in accordance with the present invention, is to progressively reduce an input current ($i_{in}$) received over line 420 down to an accurate output current ($i_{out}$) having a very small magnitude, e.g., less than 100 nanoamperes (nA). The output current ($i_{out}$) is presented to the emitter of transistor 204. The output current effects the current that passes through transistor 204 because its emitter presents a very low impedance. As such, the attenuated current becomes the charge current which is injected into filter components 120 and 122. It should be appreciated that circuit 208 is fabricated utilizing bipolar technology since it is less expensive than BiCMOS technology.

For instance, assuming that resistors 402, 406, 410, 414, and 418 each have a resistance value equal to a variable R while resistors 404, 408, 412, and 416 each have a resistance value equal to two times the value of R (i.e., 2R). It should be appreciated that the relationship of resistance values between resistors 402–418 is only exemplary of one embodiment of resistance values in accordance with the present invention. As such, the present invention is well suited to accompany a wide variety of relationships along with no relationships between the resistance values of resistors 402–418. Circuit 208 receives an input current ($i_{in}$) over line 420 which was output by emitter-coupled logic (ECL) buffer circuits 210 and 212. The input current passes through resistor 402 and then splits in half as one half of it passes through resistor 404 into ground while the other half of the input current passes through resistor 406.

The remaining half of the input current is split in half as one half of it passes through resistor 408 into ground while the other half passes through resistor 410. In other words, one quarter of the input current passes through resistors 408 and 410. The remaining quarter of the input current is then split in half as one half passes through resistor 412 into ground while the other half passes through resistor 414. Therefore, one eighth of the input current passes through resistors 412 and 414. The remaining eighth of the input current is then split in half as one half passes through resistor 416 into ground while the other half passes through resistor 418. As such, one sixteenth of the input current passes through resistor 418 and is output from circuit 208 to the emitter of transistor 204. As such, the current output from resistor 418 is an output current ($i_{out}$) for circuit 208. In this manner, circuit 208 attenuates a received input current and produces an output current to be utilized by other on-chip circuitry (e.g., filter components 120 and 122). In this configuration, the output current, $i_{out}$, injected into transistor 204 is expressed as:

$$i_{out}=(V/2R)(\tfrac{1}{2}^n)$$

where V is the input voltage ($V_{in}$) present at the line 420 of circuit 208, n is the amount to of resistor stages within circuit 208, and 2R is equal to two times the resistance value of R. It is appreciated that the amount of resistor stages within circuit 208 is determined by counting the amount of times the input current is split in half. Therefore, since circuit 208 has 4 resistor stages, $i_{out}$, is expressed as:

$$i_{out}=(V/2R)(\tfrac{1}{16})=V/32R.$$

Circuit 208 of FIG. 4 is implemented using 4 resistor stages in order to progressively reduce a received input current. It should be appreciated that circuit 208 can be implemented in accordance with the present invention using any amount of resistor stages in order to produce a small magnitude of current having a specific value. Therefore, as more resistor stages are implemented within circuit 208, the resulting output current has a smaller magnitude than the output current resulting from 4 resistor stages. Conversely, as less resistor stages are implemented within circuit 208, the resulting output current has a larger magnitude than the output current resulting from 4 resistor stages.

Although a number of different resistor configurations can be used in accordance with the present invention, Table 2 below illustrates one exemplary resistor assignment for FIGS. 1, 2, 3, and 4.

TABLE 2

| Resistor | Approximate Resistor Value (ohms) |
| --- | --- |
| 106 (a and b) | 30 k |
| 214 | 48 k |
| 216 | 48 k |
| 218 | 48 k |
| 220 | 48 k |
| 302 | 2 k |
| 304 | 2 k |
| 306 | 2 k |
| 308 | 2 k |
| 310 | 2 k |
| 312 | 2 k |
| 314 | 2 k |
| 316 | 2 k |
| 318 | 2 k |
| 320 | 2 k |
| 322 | 2 k |

TABLE 2-continued

| Resistor | Approximate Resistor Value (ohms) |
|---|---|
| 324 | 2 k |
| 326 | 2 k |
| 328 | 2 k |
| 402 | 15 k |
| 404 | 30 k |
| 406 | 15 k |
| 408 | 30 k |
| 410 | 15 k |
| 412 | 30 k |
| 414 | 15 k |
| 416 | 30 k |
| 418 | 15 k |

The present invention provides advantages to on-chip integrated circuit components. For instance, the charge pump in accordance with the present invention has the capability of providing accurate small magnitude charge pump currents to particular on-chip circuitry without utilizing a large resistor value. As such, the implementation of the charge pump uses smaller on-chip resistors which occupy smaller amounts of die area, which is more cost effective. Furthermore, the charge pump in accordance with the present invention is able to produce accurate small magnitude charge pump currents for particular on-chip circuitry utilizing available on-chip circuitry voltages. Therefore, the charge pump can be integrated on-chip together with other desirable circuit components in order to decrease the overall cost of fabricating a digital system in part by simplifying the manufacturing process. Moreover, the charge pump in accordance with the present invention provides these advantages while being fabricated utilizing bipolar technology which is less expensive than BiCMOS technology. It should be appreciated that these are a few of the advantages of the charge pump in accordance with the present invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit for providing a low differential charge pump current to a load, said circuit comprising:

a first resistor ladder having n stages, an $n^{th}$ stage of said first resistor ladder coupled to receive a first stable current form the load;

a second resistor ladder having n stages, an $n^{th}$ stage of said second resistor ladder coupled to receive a second stable current from the load; and a differential charge pump coupled to provide differential current signals to an input of said first resistor ladder and an input of said second resistor ladder, wherein said first resistor ladder and said second resistor ladder reduce the magnitude of said differential current signals which are output to change said first stable current and said second stable current.

2. The circuit as described in claim 1 wherein the load includes:

a filter element, wherein said $n^{th}$ stage of said first resistor ladder is coupled to a filter element.

3. The circuit as described in claim 2 wherein said $n^{th}$ stage of said second resistor ladder is coupled to said filter element.

4. The circuit a s described in claim 1 wherein said differential current signals output by said first resistor ladder and said second resistor ladder are less than 100 nanoamperes and greater than zero nanoamperes.

5. The circuit as described in claim 1 wherein said first resistor ladder is an R-2R resistor ladder circuit and said second resistor ladder is an R-2R ladder circuit.

6. The circuit as described in claim 1 wherein said first resistor ladder has 4 stages and said second resistor ladder has 4 stages.

7. The circuit as described in claim 6 wherein said first resistor ladder is an R-2R resistor ladder circuit and said second resistor ladder is an R-2R ladder circuit.

8. The circuit as described in claim 1 wherein said differential charge pump comprises an emitter-coupled logic (ECL) buffer circuit.

9. A circuit for providing a low differential charge pump current to a load, said circuit comprising:

a first resistor ladder circuit having n stages, an $n^{th}$ stage of said first resistor ladder circuit coupled to receive a first stable current from the load;

a second resistor ladder circuit having n stages, an $n^{th}$ stage of said second resistor ladder circuit coupled to receive a second stable current from the load; and a differential charge pump coupled to provide differential current signals to an input of said first resistor ladder circuit and an input of said second resistor ladder circuit, said differential charge pump comprising a first emitter-coupled logic (ECL) buffer circuit, wherein said first resistor ladder circuit and said second resistor ladder circuit reduce the magnitude of said differential current signals which are output to differentially change said first stable current and said second stable current.

10. The circuit as described in claim 9 wherein the load includes:

a filter element, wherein said $n^{th}$ stage of said first resistor ladder circuit is coupled to said filter element.

11. The circuit as described in claim 10 wherein said $n^{th}$ stage of said second resistor ladder circuit is coupled to said filter element.

12. The circuit as described in claim 9 wherein said differential current signals output by said first resistor ladder circuit and said second resistor ladder circuit are less than 100 nanoamperes and greater than zero nanoamperes.

13. The circuit as described in claim 9 wherein said first resistor ladder circuit is an R-2R resistor ladder circuit and said second resistor ladder circuit is an R-2R ladder circuit.

14. The circuit as described in claim 9 wherein said first resistor ladder circuit has 4 stages and said second resistor ladder circuit has 4 stages.

15. The circuit as described in claim 14 wherein said first resistor ladder circuit is an R-2R resistor ladder circuit and said second resistor ladder circuit is an R-2R ladder circuit.

16. The circuit as described in claim 9 wherein said differential charge pump comprises a second emitter-coupled logic (ECL) buffer circuit.

17. A circuit for providing a low differential charge pump current to a load, said circuit comprising:

a first R-2R resistor ladder circuit having n stages, an $n^{th}$ stage of said first R-2R resistor ladder circuit coupled to receive a first stable current from the load;

a second R-2R resistor ladder circuit having n stages, an $n^{th}$ stage of said second R-2R resistor ladder circuit coupled to receive a second stable current from the load; and a differential charge pump coupled to provide differential current signals to an input of said first R-2R resistor ladder circuit and an input of said second R-2R resistor ladder circuit, wherein said first R-2R resistor ladder circuit and said second R-2R resistor ladder circuit reduce the magnitude of said differential current signals which are output to differentially change said first stable current and said second stable current.

18. The circuit as described in claim 17 wherein said first R-2R resistor ladder circuit has 4 stages.

19. The circuit as described in claim 17 wherein said second R-2R resistor ladder circuit has 4 stages.

20. The circuit as described in claim 17 wherein said differential current signals output by said first R-2R resistor ladder circuit and said second R-2R resistor ladder circuit are less than 100 nanoamperes and greater than zero nanoamperes.

21. The circuit as described in claim 17 wherein said first R-2R resistor ladder circuit has 4 stages and said second R-2R resistor ladder has 4 stages.

22. The circuit as described in claim 17 wherein said differential charge pump comprises a first emitter-coupled logic (ECL) buffer circuit.

23. The circuit as described in claim 22 wherein said differential charge pump comprises a second emitter-coupled logic (ECL) buffer circuit.

* * * * *